US010860072B2

(12) United States Patent
Shabbir et al.

(10) Patent No.: US 10,860,072 B2
(45) Date of Patent: Dec. 8, 2020

(54) EXPECTED AND DETECTED AIR MOVER CONFIGURATIONS

(71) Applicant: Dell Products L.P., Round Rock, TX (US)

(72) Inventors: Hasnain Shabbir, Round Rock, TX (US); Jonathan David Brown, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 264 days.

(21) Appl. No.: 15/971,337

(22) Filed: May 4, 2018

(65) Prior Publication Data

US 2019/0339753 A1 Nov. 7, 2019

(51) Int. Cl.
| | | |
|---|---|---|
| *G06F 1/32* | (2019.01) | |
| *G06F 1/20* | (2006.01) | |
| *H05K 7/20* | (2006.01) | |
| *G06F 1/3206* | (2019.01) | |

(52) U.S. Cl.
CPC ............ *G06F 1/206* (2013.01); *G06F 1/3206* (2013.01); *H05K 7/20136* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10

See application file for complete search history.

(56) References Cited

U.S. PATENT DOCUMENTS

| | | | | |
|---|---|---|---|---|
| 8,788,111 B2* | 7/2014 | Uhlmann | ............... | G06F 1/206 700/299 |
| 2008/0310967 A1* | 12/2008 | Franz | ................... | F04D 27/004 417/32 |
| 2009/0099792 A1* | 4/2009 | Riegler | .................. | G06F 1/206 702/45 |
| 2009/0143002 A1* | 6/2009 | Ong | .................... | H05K 7/20727 454/184 |
| 2011/0144825 A1* | 6/2011 | Yamasaki | ................ | G06F 1/20 700/300 |
| 2012/0084551 A1* | 4/2012 | Cheng | ..................... | G06F 1/206 713/2 |
| 2013/0033213 A1* | 2/2013 | Wang | .................... | F04D 25/166 318/472 |
| 2016/0226301 A1* | 8/2016 | Lee | ........................ | H02J 9/061 |
| 2019/0242688 A1* | 8/2019 | Huang | ................ | G01D 11/245 |

* cited by examiner

*Primary Examiner* — Zahid Choudhury
(74) *Attorney, Agent, or Firm* — Jackson Walker L.L.P.

(57) ABSTRACT

An information handling system may include a processor; a memory communicatively coupled to the processor; and a cooling system that includes a plurality of air movers and a cooling system controller. The cooling system controller may be configured to: store a data structure that includes information indicative of an expected number of air movers for the information handling system, wherein the expected number of air movers is based on configuration data for the information handling system; determine a detected number of air movers in the plurality of air movers of the cooling system; and in response to a determination that the expected number of air movers is not equal to the detected number of air movers, cause an alert to be sent to a user regarding an incorrect number of air movers.

18 Claims, 2 Drawing Sheets

EXPECTED AND DETECTED AIR MOVER CONFIGURATIONS

TECHNICAL FIELD

The present disclosure relates in general to information handling systems, and more particularly to systems and methods for cooling of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, heatsinks and/or air movers (e.g., cooling fans and blowers) have often been used in information handling systems to cool information handling systems and their components.

In some instances, a baseline configuration (e.g., number, type, location, etc.) of air movers may be specified for an information handling system. If a purchaser orders some other configuration of such an information handling system, then the additional cooling needs of added information handling resources may require the inclusion of additional air movers.

Various challenges may arise based on misconfigurations in which an expected number of air movers is different from a detected number of air movers (i.e., those that are actually present) in an information handling system. For example, during the building or assembly of an information handling system, it would be desirable to have an automated way of detecting such a misconfiguration before delivery to a purchaser. Further, if a purchaser changes the configuration of an information handling system after delivery, it would be desirable to have an automated way of preventing unsafe configurations from being operated and causing damage via overheating or the like.

Further, even if such a post-delivery reconfiguration by a purchaser is not inherently unsafe (e.g., the configuration includes more air movers instead of fewer), it may not always be straightforward to determine how the additional air movers should be operated. For example, existing automated cooling control strategies might deem the additional air movers unnecessary and turn them off (or run them at some inappropriate speed such as a minimum speed). This may cause cooling degradation from unwanted air recirculation based on the unexpected airflow paths at the unused (or underused) air movers.

Even setting aside the possibility of configuration changes that occur after delivery, there is the possibility that a purchaser may specify additional air movers with an order as a way of future-proofing an information handling system (referred to herein as a cooling "upsell"). This situation may create similar challenges in detecting the validity of the configuration, and determining the correct way to utilize the additional air movers. Thus it would be desirable to be able to automatically detect the presence of an upsell configuration, and to automatically utilize the additional air movers in a productive way.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with cooling control may be reduced or eliminated.

In accordance with embodiments of the present disclosure, an information handling system may include a processor, a memory communicatively coupled to the processor, and a cooling system that includes a plurality of air movers and a cooling system controller. The cooling system controller may be configured to: store a data structure that includes information indicative of an expected number of air movers for the information handling system, wherein the expected number of air movers is based on configuration data for the information handling system; determine a detected number of air movers in the plurality of air movers of the cooling system; and in response to a determination that the expected number of air movers is not equal to the detected number of air movers, cause an alert to be sent to a user regarding an incorrect number of air movers.

In accordance with these and other embodiments of the present disclosure, a method may include storing, at a cooling system controller, a data structure that includes information indicative of an expected number of air movers for an information handling system comprising the cooling system controller, wherein the expected number of air movers is based on configuration data for the information handling system. The method may further include determining a detected number of air movers in the information handling system; and in response to a determination that the expected number of air movers is not equal to the detected number of air movers, causing an alert to be sent to a user regarding an incorrect number of air movers.

In accordance with these and other embodiments of the present disclosure, an article of manufacture may include a non-transitory, computer-readable medium having instructions thereon that are executable by a processor of a cooling system controller of an information handling system. The instructions may be executed for: storing a data structure that includes information indicative of an expected number of air movers for the information handling system, wherein the expected number of air movers is based on configuration data for the information handling system; determining a detected number of air movers in the information handling system; and in response to a determination that the expected number of air movers is not equal to the detected number of air movers, causing an alert to be sent to a user regarding an incorrect number of air movers.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
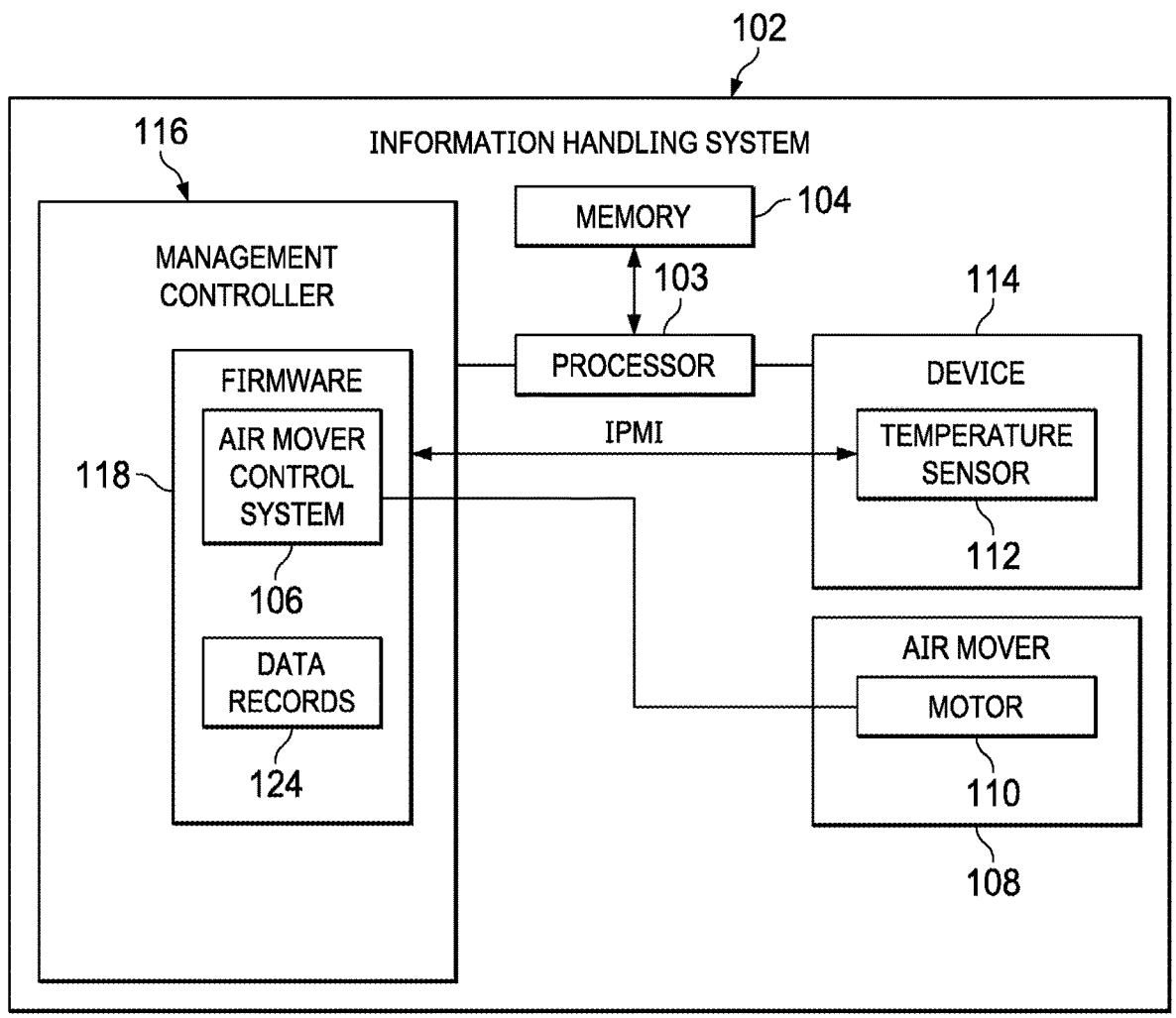
FIG. 1 illustrates a block diagram of an example information handling system, in accordance with embodiments of the present disclosure.
Figure 2:
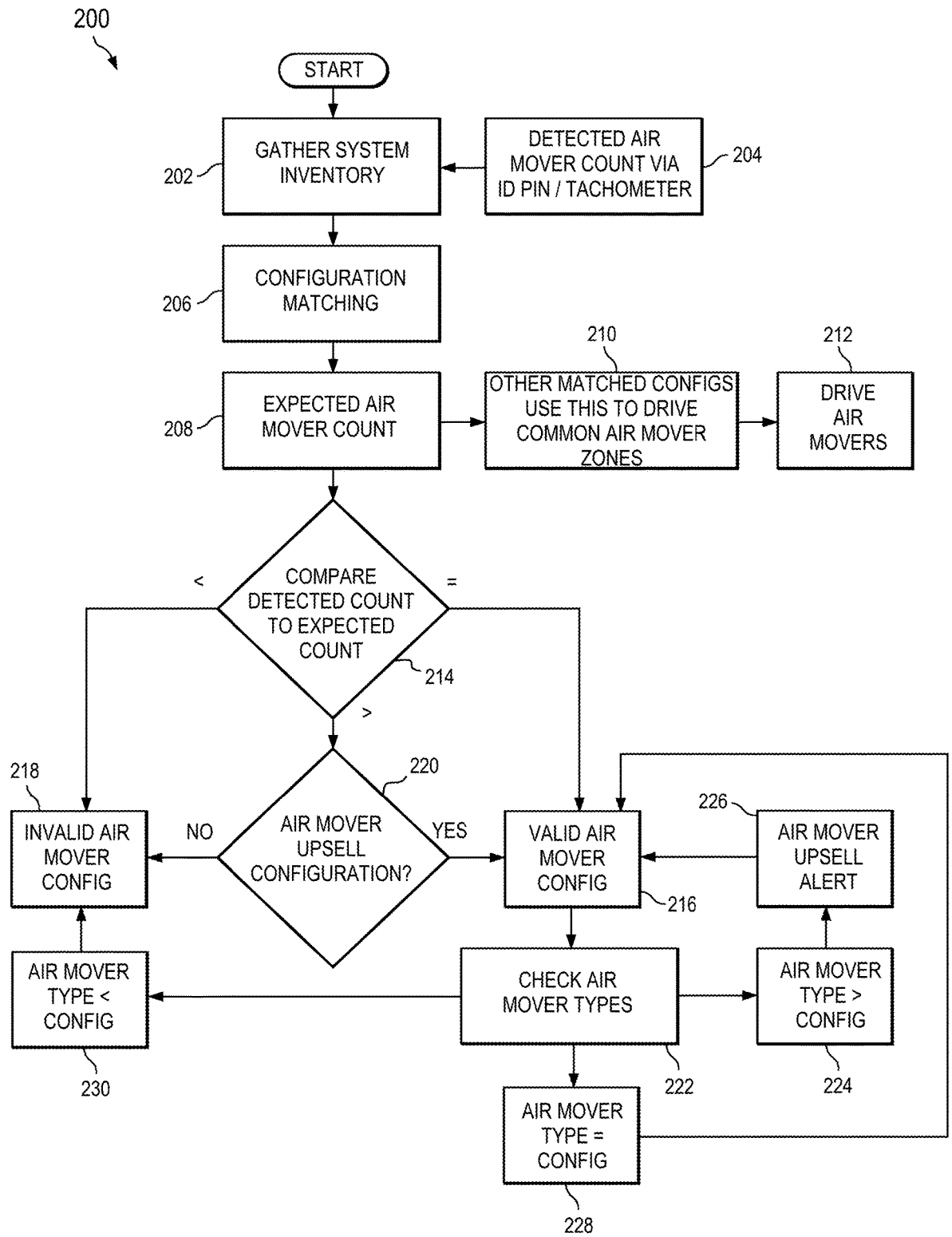
FIG. 2 illustrates a flow chart of an example method, in accordance with embodiments of the present disclosure.

Preferred embodiments and their advantages are best understood by reference to FIGS. 1 through 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected indirectly or directly, with or without intervening elements.

When two or more elements are referred to as "coupleable" to one another, such term indicates that they are capable of being coupled together.

For the purposes of this disclosure, computer-readable media (e.g., transitory or non-transitory computer-readable media) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources" herein). As shown in FIG. 1, information handling system 102 may comprise a processor 103, a memory 104, one or more air movers 108, one or more devices 114, and a management controller 116.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Memory 104 may have stored thereon an operating system. Such an operating system may comprise any program of executable instructions, or aggregation of programs of executable instructions, configured to manage and/or control the allocation and usage of hardware resources such as memory, processor time, disk space, and input and output devices, and provide an interface between such hardware resources and application programs hosted by the operating system. In addition, the operating system may include all or a portion of a network stack for network communication via a network interface (e.g., one of devices 114 may be a network interface for communication over a data network). Although the operating system may be stored in memory 104, in some embodiments it may be stored in storage media accessible to processor 103, and active portions of the operating system may be transferred from such storage media to memory 104 for execution by processor 103.

Air mover 108 may be communicatively coupled to air mover control system 106 of management controller 116, and may include any mechanical or electro-mechanical system, apparatus, or device operable to move air and/or other gases. In some embodiments, air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by the air mover control signal communicated from air mover control system 106. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heatsinks (not explicitly shown) internal to the enclosure to cool one or more information handling resources.

Device 114 may be communicatively coupled to processor 103 and may generally include any information handling resource. In some embodiments, device 114 may include a temperature sensor 112. Temperature sensor 112 may be any system, device, or apparatus (e.g., a thermometer, thermistor, etc.) configured to generate an electrical signal indicative of a sensed temperature within or proximate to device 114. Signals may be received from temperature sensors 112 (e.g., via an Intelligent Platform Management Interface connection) at management controller 116 and may be used to implement various types of cooling strategies by air mover control system 106. Some examples of such cooling strategies are disclosed in U.S. Patent Publication No. 2017/0329651, which is incorporated by reference herein in its entirety.

Management controller 116 may be configured to provide out-of-band management facilities for management of information handling system 102. Such management may be made by management controller 116 even if information handling system 102 is powered off or powered to a standby state. Management controller 116 may include a processor, memory, an out-of-band network interface separate from and physically isolated from an in-band network interface of information handling system 102, and/or other embedded information handling resources. In certain embodiments, management controller 116 may include or may be an integral part of a baseboard management controller (BMC) or a remote access controller (e.g., a Dell Remote Access Controller or Integrated Dell Remote Access Controller). In other embodiments, management controller 116 may include or may be an integral part of a chassis management controller (CMC).

As shown in FIG. 1, management controller 116 may include firmware 118. Firmware 118 may include a program of executable instructions configured to be read and executed by management controller 116 in order to carry out the functionality of management controller 116, including that functionality described herein. For example, firmware 118 may embody an air mover control system 106 (which may also be referred to herein as a cooling controller). Firmware 118 may also include data (e.g., data that need not be executable) such as data records 124. In other embodiments, air mover control system 106 and/or data records 124 may reside on storage media of management controller 116 other than firmware 118 (not shown explicitly).

Air mover control system 106 may include any system, device, or apparatus configured to detect available air movers within information handling system 102, receive one or more signals indicative of one or more temperatures within information handling system 102 (e.g., one or more signals from one or more temperature sensors 112), receive information regarding thermal parameters of information handling resources (e.g., information from power and/or thermal tables of management controller 116 and/or data records 124) and based on such signals and thermal parameters, calculate an air mover driving signal to maintain an appropriate level of cooling, increase cooling, or decrease cooling, as appropriate, and communicate such air mover driving signal to air mover 108.

In various embodiments, air mover control system 106 may operate air movers 108 in an open-loop or a closed-loop fashion.

Firmware 118 may also include information regarding cooling strategies in a data structure. A data structure such as a map, list, array, table, or other suitable data structure may include one or more data records 124, each such data record 124 setting forth information regarding a particular cooling strategy and one or more "scaling factors." A data record may be any suitable data type that includes such information (e.g., a row of a table, etc.).

The information in data records 124 may be stored in a data structure that is incorporated into a firmware 118 of management controller 116. In other embodiments, the data structure may also be stored elsewhere (e.g., in a computer-readable medium accessible to management controller 116). In these and other embodiments, the data structure may be organized internally as a plurality of separate data structures.

A scaling factor may be used to specify a desired fan speed or a desired volume of airflow, relative to some baseline amount. For example, a scaling factor of 1.00 would indicate that an air mover should be operated at its nominal baseline speed. A scaling factor of 2.00 would indicate that an air mover should be operated at twice its nominal baseline speed (or in other embodiments, operated to produce twice its nominal baseline amount of airflow in cubic feet per minute).

Scaling factors may be applied to individual air movers, to zones of air movers, to particular modules associated with one or more air movers, or to entire information handling systems in various embodiments.

In particular, some embodiments of this disclosure allow for air mover control system 106 to detect a configuration of information handling system 102 and match that configuration against one or more data records 124 of a thermal table that specify known configurations and their cooling strategies. Air mover control system 106 may then determine whether or not the system is safe to operate, and if so, how the various air movers should be controlled.

In addition to processor 103, memory 104, air mover control system 106, air mover 108, temperature sensor 112, device 114, and management controller 116, information handling system 102 may include one or more other information handling resources.

FIG. 2 illustrates a flow chart of an example method 200 for controlling air movers, in accordance with embodiments of the present disclosure. According to certain embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen. In these and other embodiments, method 200 may be implemented as hardware, firmware, software, applications, functions, libraries, or other instructions.

Method 200 may be carried out by a controller of a cooling system of an information handling system, which may in some embodiments be (or be a part of) a management controller. Such a cooling controller may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data.

At step 202, the cooling controller gathers a system inventory of the information handling system. This step may include polling the various devices and buses of the information handling system to determine what types and quantities of information handling resources are present.

Further, at step 204, the cooling controller may detect the air movers that are present in the information handling system. Such detection may include detecting the air movers via an identification pin, a tachometer signal, or any other suitable method. In some embodiments, it may also include detecting the various types of air movers that are present (e.g., fans vs. blowers, standard air movers vs. high-performance air movers, etc.).

At step 206, the system inventory may be compared against various known configurations to determine one or more matching configurations. For example, the cooling controller may include a data structure comprising a thermal table having data records with information regarding a set of known factory configurations, one or more of which may be matched by the system inventory that has been gathered.

In some embodiments, multiple such data records may be matched by the configuration of information handling system 102. As one example, this may be true for data records having varying levels of specificity. That is, a particularly detailed data record may exactly match every component present in information handling system 102, while a less detailed data record may simply not specify certain of the configuration choices that went into information handling system 102. For example, the cooling strategy may not depend upon what brand of network interface card is present in information handling system 102, and so a data record may not specify that configuration choice at that level of detail.

Once one or more matching configurations have been determined, the air movers that are both present and expected may be driven with scaling factors selected according to the matched configuration(s) to provide cooling to the various air mover zones at steps 210 and 212.

At step 214, the detected air movers that were determined at step 204 may be compared to the expected air movers from the matched configuration(s). If the numbers of air movers are equal, the cooling controller may determine at step 216 that the air mover configuration is valid.

If there are fewer detected air movers than expected, the cooling controller may determine at step 218 that an invalid air mover configuration is present. The cooling controller may then take appropriate actions, such as alerting a user or administrator, preventing the system from operating, etc.

If there are more detected air movers than expected, it is possible that an upsell configuration has been installed. Thus the cooling controller determines whether this is the case at step 220 (e.g., by reference to configuration data from the factory, etc.).

If no upsell configuration of air movers has been installed, then the cooling controller may determine that the configuration is invalid at step 218. As above, the cooling controller may then take appropriate actions, such as alerting a user or administrator, preventing the system from operating, etc.

If, instead, an upsell configuration is present, the cooling controller may conclude that the configuration of air movers is valid at step 216. For example, in making this determination, the cooling controller may determine the exact nature of the upsell and compare that to the detected air movers.

In some embodiments, the cooling controller may also be operable to compare at step 222 the types of air movers present to those expected. For example, certain types of high-performance air movers may be treated as providing additional cooling when compared to the standard air movers.

At step 228, if the air mover type(s) are the same as what is expected based on the matched configuration(s), then the controller may determine at step 216 that the configuration is valid.

If, instead, the air mover types are less effective than those expected at step 230, the controller may determine at step 218 that an invalid configuration is present.

If, on the other hand, the air mover types are more effective than those expected at step 224, then the controller may conclude that a valid upsell configuration is present at steps 226 and 216.

In the cases in which a valid configuration exists but includes additional (or more powerful types of) air movers compared to the expected configuration, the cooling controller may determine the best way to utilize such additional, unexpected air movers. In some embodiments, such air movers may be assigned to air mover zones based, for example, on their placement within a chassis.

In some embodiments, the cooling controller may allow other additionally listed configurations to drive those air movers that correspond to the expected air mover configuration, without having the need for these configurations to define exactly which air movers should be driven (with the assumption that at least one configuration has been defined that requires a specific fan zone to be driven). This may significantly simplify thermal table implementation, in that only certain key configurations for each fan (or collection of fan zones) may need to be defined.

Thus, for example, an extra air mover located near a group of hard drives may be operated in coordination with the other air movers that are configured to cool those hard drives. This may include simply matching the scaling factor of those other air movers, or it may include intelligently treating the fans as a unified, cooperative group.

For example, if the cooling strategy in effect demands more cooling than is available from the expected air movers (e.g., a cooling calculation determines that they should be driven at more than 100% of their maximum rated speed), then the strategy may instead operate the additional air mover at a higher speed instead of attempting to drive the expected air movers at unreasonable speeds. Thus the additional air movers may be used to supplement the expected air movers in an intelligent manner.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using any of the various components disclosed herein (such as the components of FIG. 1), and/or any other system operable to implement method 200. In certain embodiments, method 200 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
    a processor;
    a memory communicatively coupled to the processor; and
    a cooling system that includes a plurality of air movers and a cooling system controller;
    wherein the cooling system controller is configured to:
        store a data structure that includes information indicative of an expected number of air movers for the information handling system, wherein the expected number of air movers is based on configuration data for the information handling system;
        determine a detected number of air movers in the plurality of air movers of the cooling system;
        in response to a determination that the expected number of air movers is less than the detected number of air movers, cause an alert to be sent to a user regarding an incorrect number of air movers; and
        prevent the alert from being sent to the user in response to a determination that the information handling system is in an air mover upsell configuration.

2. The information handling system of claim 1, wherein the cooling system controller is further configured to:
    determine an upsell air mover corresponding to the air mover upsell configuration;
    associate the upsell air mover with at least one other air mover of the information handling system;
    determine a scaling factor for the upsell air mover based on the at least one other air mover; and
    cause the upsell air mover to operate at a speed corresponding to the scaling factor.

3. The information handling system of claim 1, wherein the configuration data includes information regarding information handling resources of the information handling system.

4. The information handling system of claim 3, wherein the information regarding the information handling resources of the information handling system includes information regarding cooling requirements.

5. The information handling system of claim 1, wherein the information indicative of the expected number of air movers specifies a plurality of types of air movers.

6. The information handling system of claim 1, wherein the cooling system controller is a management controller of the information handling system.

7. The information handling system of claim 1, wherein the detected number of air movers is determined via one or more fan identification pins.

8. The information handling system of claim 1, wherein the detected number of air movers is determined via one or more tachometer signals.

9. A method comprising:
    storing, at a cooling system controller, a data structure that includes information indicative of an expected number of air movers for an information handling system comprising the cooling system controller, wherein the expected number of air movers is based on configuration data for the information handling system;
    determining a detected number of air movers in the information handling system; and
    in response to a determination that the expected number of air movers is less than the detected number of air movers, causing an alert to be sent to a user regarding an incorrect number of air movers; and
    preventing the alert from being sent to the user in response to a determination that the information handling system is in an air mover upsell configuration.

10. The method of claim 9, wherein the information indicative of the expected number of air movers specifies a plurality of types of air movers, and wherein the alert is further in response to a detection that a type of an air mover is not the same as a type of a corresponding expected air mover.

11. An article of manufacture comprising a non-transitory, computer-readable medium having instructions thereon that are executable by a processor of a cooling system controller of an information handling system for:
    storing a data structure that includes information indicative of an expected number of air movers for the information handling system, wherein the expected number of air movers is based on configuration data for the information handling system;
    determining a detected number of air movers in the information handling system;

in response to a determination that the expected number of air movers is less than the detected number of air movers, causing an alert to be sent to a user regarding an incorrect number of air movers; and preventing the alert from being sent to the user in response to a determination that the information handling system is in an air mover upsell configuration.

12. The article of claim 11, wherein the instructions are further for:

determining an upsell air mover corresponding to the air mover upsell configuration;

associating the upsell air mover with at least one other air mover of the information handling system;

determining a scaling factor for the upsell air mover based on the at least one other air mover; and causing the upsell air mover to operate at a speed corresponding to the scaling factor.

13. The article of claim 11, wherein the configuration data includes information regarding information handling resources of the information handling system.

14. The article of claim 13, wherein the information regarding the information handling resources of the information handling system includes information regarding cooling requirements.

15. The article of claim 11, wherein the information indicative of the expected number of air movers specifies a plurality of types of air movers.

16. The article of claim 11, wherein the cooling system controller is a management controller of the information handling system.

17. The article of claim 11, wherein the detected number of air movers is determined via one or more fan identification pins.

18. The article of claim 11, wherein the detected number of air movers is determined via one or more tachometer signals.

* * * * *